United States Patent [19]
Kondo et al.

[11] Patent Number: 5,274,197
[45] Date of Patent: Dec. 28, 1993

[54] ELECTRONIC-PARTS MOUNTING BOARD AND ELECTRONIC-PARTS MOUNTING BOARD FRAME

[75] Inventors: Mitsuhiro Kondo; Atsushi Hiroi; Kinya Ohshima, all of Ogaki, Japan

[73] Assignee: Ibiden Co., Ltd., Japan

[21] Appl. No.: 797,032

[22] Filed: Nov. 25, 1991

[30] Foreign Application Priority Data

Nov. 27, 1990 [JP] Japan .................. 2-327457
Feb. 19, 1991 [JP] Japan .................. 3-024662

[51] Int. Cl.$^5$ ............................. H05K 1/00
[52] U.S. Cl. ...................... 174/267; 361/813; 257/666
[58] Field of Search ........... 174/267, 52.4; 361/398, 361/404, 421; 257/670, 672, 676, 666; 29/827

[56] References Cited

U.S. PATENT DOCUMENTS

| | | | |
|---|---|---|---|
| 4,870,474 | 9/1989 | Karashima . | |
| 4,908,933 | 3/1990 | Sagisaka et al. | 29/827 |
| 4,949,225 | 8/1990 | Sagisaka et al. | 361/414 |
| 4,951,120 | 8/1990 | Hagiwara et al. | 357/68 |
| 5,022,960 | 6/1991 | Takeyama et al. | 156/643 |
| 5,170,328 | 12/1992 | Kruppa | 361/398 |

FOREIGN PATENT DOCUMENTS 59-98545 6/1984 Japan .
48907 7/1989 Japan .

*Primary Examiner*—Leo P. Picard
*Assistant Examiner*—Cheryl R. Figlin
*Attorney, Agent, or Firm*—Bacon & Thomas

[57] ABSTRACT

An electronic-parts mounting board frame is formed by assembling a plurality of electronic-parts mounting boards into a single frame. The mounting boards may be electrically connected to the frame by separate inner and outer lead frames, the former being formed in the mounting boards and the latter being integral with the frame.

13 Claims, 9 Drawing Sheets

ELECTRONIC-PARTS MOUNTING BOARD AND ELECTRONIC-PARTS MOUNTING BOARD FRAME

BACKGROUD OF THE INVENTION

1. Field of the Invention

The present invention relates to an electronic-parts mounting board, and an electronic-parts mounting board frame with a plurality of electronic-parts mounting boards assembled thereinto.

2. Discussion of the Related Art

Various types of electronic-parts mounting boards have been proposed. One of those known electronic-parts mounting boards is an electronic-parts package, or a semiconductor device. In the package, after an electronic part is mounted on the board, the board is entirely covered for sealing purposes with a so-called resin mold, while the outer leads of the board protrude outwardly from the resin mold.

An electronic-parts mounting board sealed with a resin mold is disclosed in Japanese Patent Laid-Open Publication No. Sho. 59-98545, entitled "Pellet Mounting Board," which is for a semiconductor device. The publication claims a pellet mounting board "wherein a pellet is mounted on a pellet mounting board with a conductive layer, bonding pads of said pellet are electrically connected to said conductive layer by a wire bonding method, and said conductive layer of said pellet conductive layer by a wire bonding method, and said conductive layer of said pellet mounting board is bonded to a lead frame." The disclosed pellet mounting board suffers from the following problems, however:

1) Solder is used for bonding the conductive layer of the pellet mounting board (referred to as a board) to the lead frame. Each portion (pad) subjected to the soldering lies on an insulating substrate. Accordingly, the pad tends to peel off the insulating board when it is heated for soldering.

2) The insulating substrate is located between the pads. Solder mistakenly left on the insulating substrate possibly may cause an electrical short between the pads.

3) The thermal expansion coefficient of the board is different from that of the lead frame. When the pellet (electronic part) heats, the lead frame tends to peel off the board. One possible cause of the peel-off is warping of the lead frame.

4) The major surfaces of the insulating substrate do not fully utilize the space available to form the conductive circuits.

To cope with the above problems, an electronic-parts mounting board has been proposed which is constructed such that an insulating substrate is applied to both sides of the lead frame, to form a one piece construction, and the conductive circuits on the insulating substrate are electrically connected to the leads through the through-holes.

To be more specific, the proposed mounting board uses lead frames each having leads, connected by tie bars, that are constructed such that inner leads are electrically connected to the conductive circuits through the through-holes, and outer leads protrude from both the insulating board and the resin mold and are physically continuous.

The electronic-parts mounting board thus constructed still involves unsolved problems, however, as follows:

5) In recent usage of the electronic-parts mounting board, a plurality of electronic-parts mounting boards are assembled into a frame, in order to routinely and efficiently mount electronic parts on the board and to seal the structure with a resin mold. To assemble the insulating board based electronic-parts mounting boards into the lead frame, a single metal plate is punched to form leads in the locations where a plurality of electronic-parts mounting boards are to be formed. Insulating substrates, separately formed, are coupled with the leads.

6) In the electronic-parts mounting boards thus assembled into one frame, if a part of the lead frame is defective, the whole lead frame must be treated as being defective. Accordingly, the remaining non-defective parts of the lead frame are wasted. The portions of the lead frame to be used for the electronic-parts mounting boards require especially delicate working for their formation. The cost to form those portions is higher than that to form other portions. Therefore, replacement of only those portions to be used for the electronic-parts mounting boards with non-defective portions would be very advantageous.

7) Since a plurality of electronic-parts mounting boards are assembled into a single lead frame, the whole lead frame must be individually designed and manufactured so as to have a shape in conformity with the shape of the electronic-parts mounting boards. In this respect, the versatility of the lead frame in usage is poor.

8) The electronic-parts mounting board must be subjected to electrical checks or tests in the stages of manufacturing the board. Certainty of the process of subjecting the board to electrical testing would be highly advantageous.

Studies made by the inventors to solve the above problems and to reduce the disadvantages of the electronic-parts mounting board have resulted in the present invention.

SUMMARY OF THE INVENTION

The present invention has been made in view of the above circumstances and has as an object the provision of an electronic-parts mounting board and an electronic-parts mounting board frame in which, when a part of the board and the board frame is defective, only the defective part can be replaced with a non-defective one, thereby providing a high production yield, high reliability, and low cost.

Another object of the invention is to provide an electronic-parts mounting board and an electronic-parts mounting board frame in which simplified electrical testing may be accomplished during manufacture.

An additional object of the invention is to provide an electronic-parts mounting board and an electronic-parts mounting board frame in which only a defective part can be replaced and in which handling and framing of the boards is simplified.

Finally, yet another object of the invention is to provide an electronic-parts mounting board having a standardized inner lead frame and a mounting board with integral but separate, and therefore easily customized, outer lead frames for electrical connection with the standarized inner lead frame.

To achieve the above objects, the invention preferably provides an electronic-parts mounting board frame constructed such that a plurality of electronic-parts mounting boards are assembled into a single frame, wherein a plurality of leads formed in each electronic-parts mounting board are formed from a member discrete from the member constituting the frame, and are electrically connected to the frame.

In the preferred electronic-parts mounting board frame, a plurality of electronic-parts mounting boards are separately formed. Those boards are assembled into a frame by means of leads. Therefore, a defective electronic-parts mounting board, may be replaced with a non-defective board without wasting other non-defective boards.

According to another aspect of the invention, there is provided an electronic-parts mounting board frame constructed such that a plurality of electronic-parts mounting boards are assembled into a single frame, wherein a plurality of leads for each electronic-parts mounting board include outer leads integral with the frame and inner leads formed of a discrete member separate from the frame and the outer leads, an insulating substrate is applied to both sides of the inner leads such that the inner leads protrude from the insulating substrate and the protruding inner leads are electrically connected to the outer leads, whereby the plurality of electronic-parts mounting boards are assembled into the frame.

Thus, in this preferred electronic-parts mounting board frame, the leads include the inner leads to which the insulating substrate is applied, and the separate outer leads to be connected to the inner leads protruding from the insulating substrate. More specifically, the invention preferably includes an inner lead frame in which the inner leads are connected by tie bars, and an outer lead frame including outer leads which are integral with the frame, the inner and outer lead frames being electrically connected by, for example, soldering.

According to still another aspect of the invention, there is provided an electronic-parts mounting board frame constructed such that a plurality of electronic-parts mounting boards are assembled into a single mounting board frame, wherein a plurality of electronic-parts mounting boards are assembled into the mounting board frame, to form a one-piece construction in such a manner that an insulating substrate is applied to both sides of the lead frames, each lead frame including an individually formed outer frame which is fixed to the mounting board frame.

In this variation of the inventive electronic-parts mounting board frame, the outer frame is provided on the peripheral side of the leads to which the insulating substrate is applied. When the plurality of the electronic-parts mounting boards are assembled into one mounting board frame, the outer frame of each electronic-parts mounting board is fixed to the mounting board.

BRIEF DESCRIPTION OF THE DRAWINGS

The accompanying drawings, which are incorporated in and constitute a part of this specification illustrate embodiments of the invention and, together with the description, serve to explain the objects, advantages and principles of the invention. In the drawings.

DETAILED DESCRIPTION OF THE PREFERRED EMBODIMENTS

Figure 1:
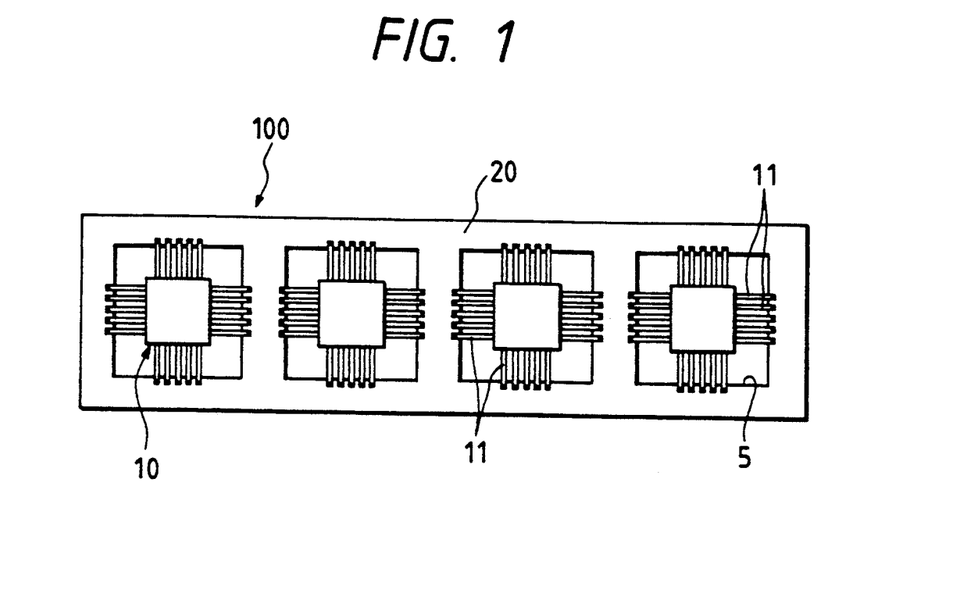
FIG. 1 is a plan view showing an electronic-parts mounting board frame according to a first embodiment of the invention.
Figure 2:
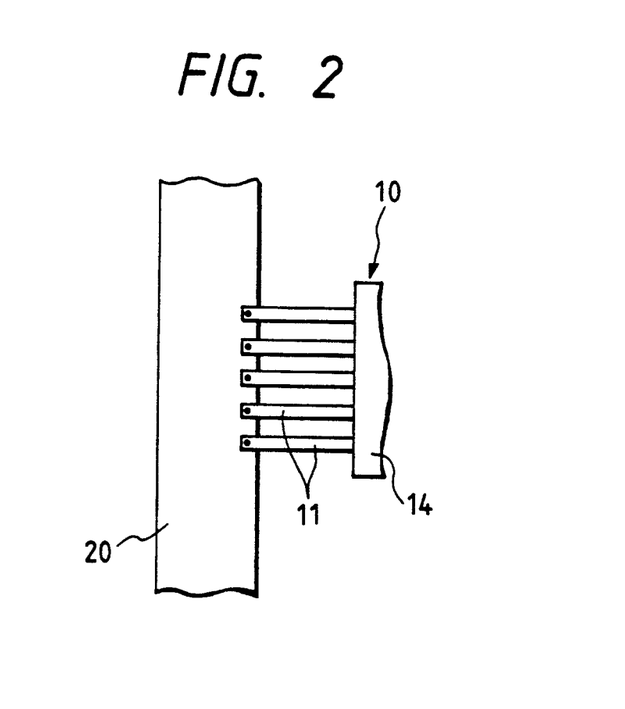
FIG. 2 is a plan view showing in enlarged fashion how each electronic-parts mounting board is coupled with a frame.
Figure 10:
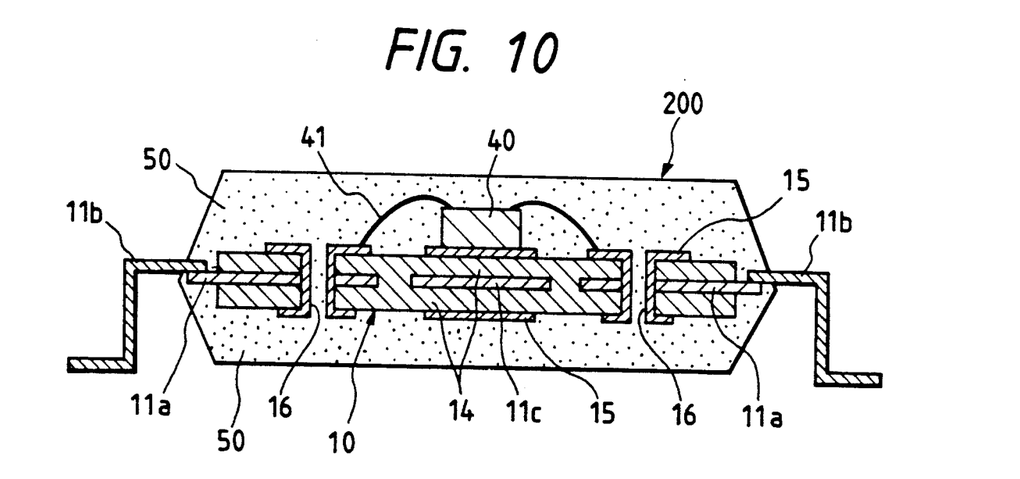
FIG. 10 is a vertical sectional view showing in enlarged fashion a semiconductor device using the electroinc-parts mounting board of the electronic-parts mounting board frame according to the second embodiment.
Figure 17:
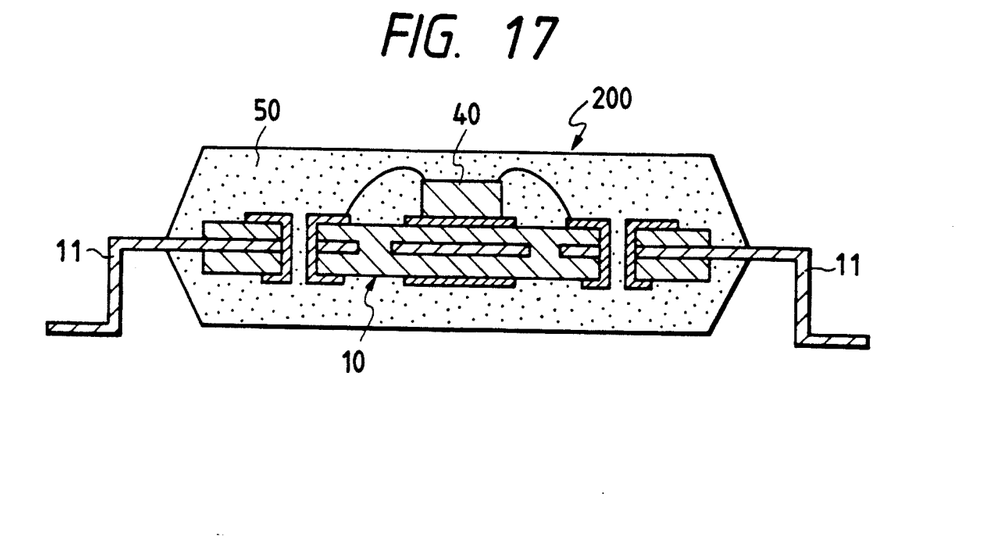
FIG. 17 is a vertical sectional view showing a semiconductor device constructed using the electronic-parts mounting board of FIG. 11.

FIGS. 1 and 2 illustrate an electronic-parts mounting board frame 100 according to a first embodiment of the present invention. As shown therein, four electronic-parts mounting boards 10 are mounted on a single frame 20, to form a single unit. In each electronic-parts mounting board 10, an insulating substrate 14 is applied to the inner sides of groups of leads 11, and the inner sides of the boards and the leads groups are unified into a single piece construction. As shown in FIG. 10, conductive circuits 15 formed on the insulating substrate 14 are selectively and electrically connected to the grouped leads 11 through through-holes 16. The external ends of the respective leads 11, are shown in FIG. 2, protrude from the insulating substrate 14. The electronic-parts mounting board 10, which is to be assembled into the electronic-parts mounting board frame 100, may be completed as a semiconductor device 200, after an electronic part 40 is mounted thereon. In this case, as shown also in FIG. 17, the end faces of a mold resin 50 thereof are positioned on the leads 11. Thus, the frame 20 is used only for supporting each electronic-parts mounting board 10 by means of the leads 11. In the semiconductor device 200 as shown in FIGS. 10 and 17, the frame is not used.

The frame 20, as shown in FIG. 1, is a plate-like member with a number of openings 5 for receiving the electronic-parts mounting boards 10. With the shape of the frame as illustrated, the frame 20 has a rigidity high enough not only to support the electronic-parts mounting boards 10 but also to allow the frame itself to be transferred to a mounting apparatus for mounting the electronic parts 40 and a transfer mold apparatus for the mold resin 50.

Figure 14:
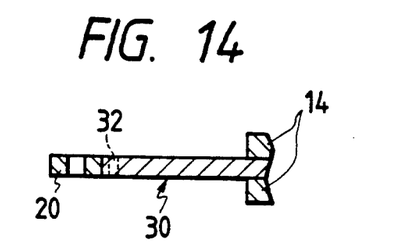
FIG. 14 is a sectional view taken on line XIV—XIV in FIG. 13.
Figure 15:
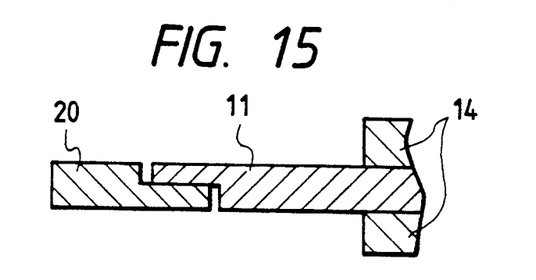
FIG. 15 is a sectional view showing another connection of the frame 30 to the leads 11 according to the first embodiment of the invention.

The electronic-parts mounting boards 10 are mounted on the frame 20 in such a manner that the leads 11, as shown in FIG. 2, are connected at their tips to the frame 20 by suitable means, such a spot welding or soldering, for example. In this instance, to connect the leads 11 to the frame 20, the leads 11 are directly placed on the frame 20, as shown in FIG. 2. Alternatively, the tips or ends of the leads may abut against the frame as shown in FIG. 14 or the half-etched ends of the leads may be coupled with the half-etched edge of the frame as shown in FIG. 15.

In the electronic-parts mounting board frame 100 thus constructed, which is the first embodiment of the invention, a plurality of electronic-parts mounting boards 10 are assembled into one frame 20 and fixed thereto by means of the grouped leads 11. With this construction, if one of the electronic-parts mounting boards 10 is defective, the defective board may be replaced with a non-defective one, while the remaining ones may be used as they are. The electronic-parts mounting board frame 100 is of course constructed so as to provide for efficient mounting of the electronic part 40 and to seal the substantially whole electronic part 40 within the mold resin 50, as shown in FIG. 10 or 17.

The electronic-parts mounting board frame 100 includes two separate members; one member is for the leads 11 for the electronic-parts mounting boards 10, and the other is for the frame 20 for supporting the electronic-parts mounting boards 10. As a result, the cost of manufacture of the electronic-parts mounting board frames 100 is reduced because the simpler structure members, i.e., the frames 20, and the more complicated members, such as leads 11, may be separately manufactured. Furthermore, the cost to manufacture the semiconductor devices 200 using the electronic-parts mounting boards 10 is also reduced. When the boards are used for the semiconductor devices 200, the frames 20 are not used. Those frames may be used later, if required.

The electronic-parts mounting boards 10 are individually manufactured as products having the leads 11. Therefore, those boards can be electrically tested board by board. The leads when electrically separated as shown in FIG. 2, may also be tested in a simple manner lead by lead.

A second embodiment of an electronic-parts mounting board frame 100 according to the present invention will be described with reference to FIGS. 3 to 10 and 18. In this embodiment of the frame 100, the leads 11 for connecting the electronic-parts mounting board 10 to external components or devices are each divided into two portions, an inner lead 11a and an outer lead 11b. The jointed portions of the inner and outer leads 11a and 11b are disposed within the mold resin 50, when the electronic-parts mounting boards 10 are completed as the semiconductor devices 200, as shown in FIG. 10. In the figures, a single electronic-parts mounting board 10 and its related parts are illustrated for simplicity. The frame 20 is located outside an outer lead frame 13 integral with groups of outer leads 11b. A plurality of outer lead frames 13 are assembled into a single frame 20, to form a single unit.

Figure 3:
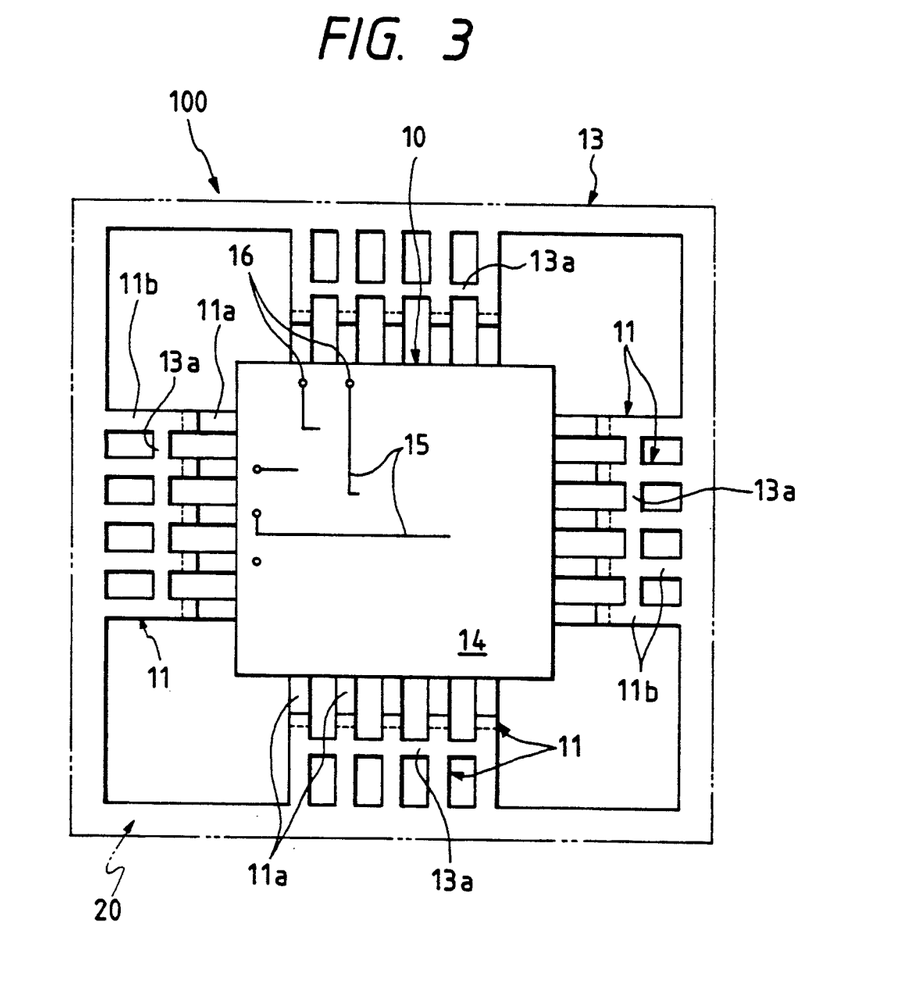
FIG. 3 is a plan view showing an electronic-parts mounting board frame according to a second embodiment of the invention, the illustration typically showing one electronic-parts mounting board in connection with a frame.

FIG. 3 is a plan view showing one of the electronic-parts mounting boards 10, which are to be assembled into an electronic-parts mounting board frame 100 according to the present invention. An insulating substrate 14 including conductive circuits 15 is disposed in the central part of the board. The outer leads 11b of the leads 11 protrude from the insulating substrate 14. The leads 11 of the board 10 are constructed such that the inner leads 11a of an inner lead frame 12 are electrically and physically connected to the outer leads 11b of the outer lead frame 13, respectively, by suitable means, such as by soldering.

Figure 4:
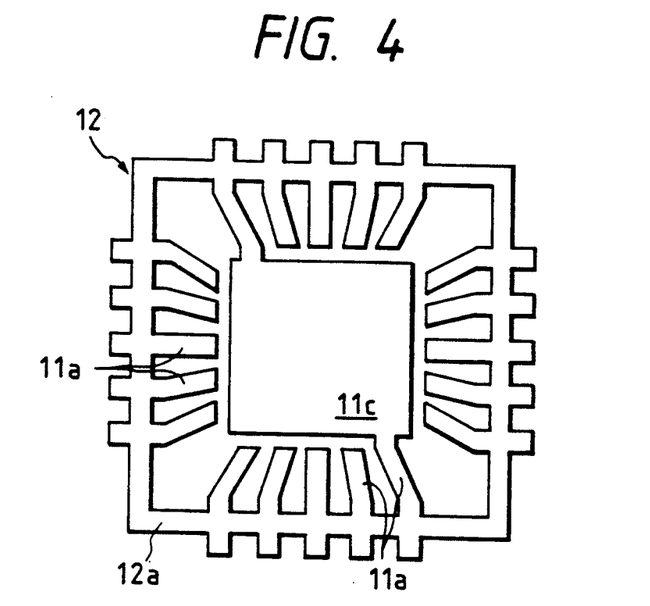
FIG. 4 is a plan view showing an inner lead frame of the electronic-parts mounting board used in the electronic-parts mounting board frames of FIG. 3.
Figure 5:
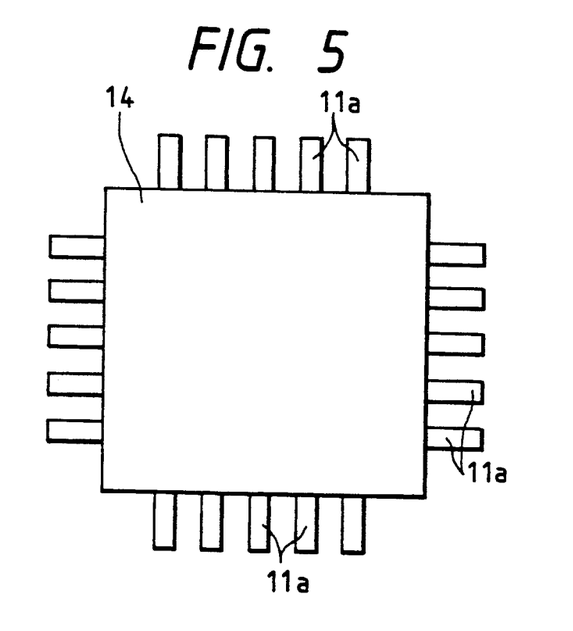
FIG. 5 is a plan view showing the inner lead frame when an insulating substrate is applied to the lead frame, and tie bars are removed from the lead frame.
Figure 6:
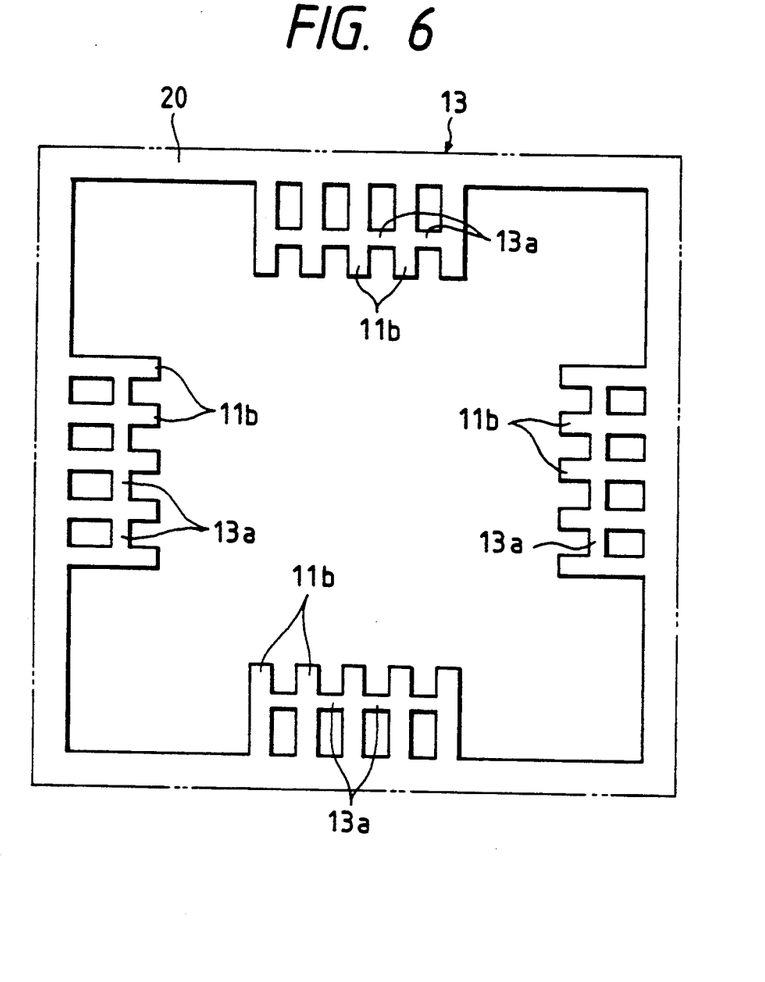
FIG. 6 is a plan view showing one of outer lead frames 13 with which the electronic-parts mounting board shown in FIG. 5 is to be coupled.

For forming the electronic-parts mounting boards 10, a plurality of inner lead frames 12 as shown in FIG. 4 and a plurality of outer lead frames 13 as shown in FIG. 6 which are assembled into the frame 20 are prepared. The inner lead frames 12 and the outer lead frames 13 which are assembled into the frame 20, are separately manufactured. The frame 12 shown in FIG. 4 is formed by punching or etching out of a metal plate inner leads 11a, which are connected by means of tie bars 12a. The metal plate is made of a materiall such as 42 alloy or copper composite material. An insulating substrate 14 on which conductive circuits 15 have been formed or are to be formed, is applied to the central part to form a unit, as shown in FIG. 5, in which the inner leads 11a are caused to protrude from the insulating substrate 14. The protrusion of the inner leads 11a is made because the inner leads 11a must be coupled with the outer leads 11b in later manufacturing steps. In the inner lead frame 12 shown in FIG. 4, a terminal 11c which will serve as a base terminal or ground terminal is formed in the central part toward which the inner leads 11a are extended. Preferably, some of the inner leads 11a are connected to a central terminal 11c. The central terminal 11c is, however, not essential to the invention.

As shown in FIG. 10, necessary conductive circuits 15 are formed on the inner lead frame 12 with the insulating substrate 14 applied thereto as shown in FIG. 5, and through-holes 16 are formed therein to electrically connect the conductive circuits 15 to the inner leads 11a. In the inner lead frame 12, both sides of which are covered with the insulating substrate 14, the tie bars 12a which tie the inner leads 11a together are cut off, for example, by a press machine, as shown in FIG. 5. As a result, although the inner leads 11a are each electrically connected to the conductive circuits 15 on the insulating substrate 14 through the through-holes 16, they nevertheless protrude separately from the insulating substrate 14.

Let us consider the outer lead frames 13 which are assembled into the frame 20. Typically, in one outer lead frame 13, as shown in FIG. 6, the outer leads 11b are connected by tie bars 13a, the lead frame being punched out of a metal plate made of 42 alloy or copper composite material, for example. In the illustrated example, the number of inner leads 11a of the inner lead frame 12 is equal to the number of outer leads 11b of the outer lead frame 13. However, if required, the numbers of leads need be not equal to each other. For example, where the electronic-parts mounting board is used as a semiconductor device 200, the number of outer leads 11b of the outer lead frame 13 need only be that required for the semiconductor device 200.

In assembling the electronic-parts mounting board frame, the outer lead frames 13 thus constructed are positioned so that the ends of the outer leads 11b respectively confront the ends of the inner leads 11a of the inner lead frame 12. Then, those leads are electrically connected by soldering, for example, and the tie bars, 13a, which are now unnecessasry, are cut off for removal by well known means. Finally, the electronic-parts mounting boards 10 are formed. In this case, the inner leads 11a and the outer leads 11b may be connected by using a) solder as just mentioned,
b) conductive adhesive,
c) anisotropic conductive rubber, or
d) any other suitable connection means.

If any of those is used, the connecting work is performed while securing the electrical conduction therebetween.

Figure 7:
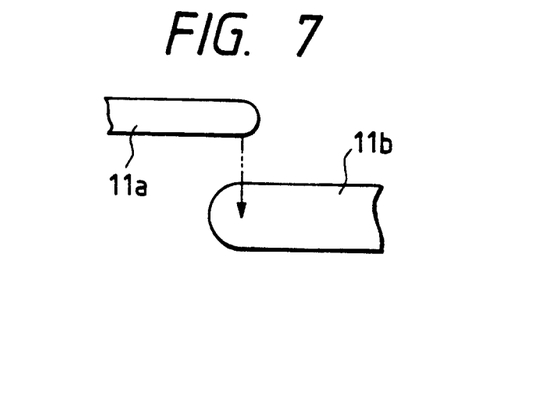
FIG. 7 is a diagram showing one of the coupling modes when the inner lead portions of the electronic-parts mounting board are connected to the outer lead portions of the outer lead frame, the illustration typically showing the connection of one inner lead portion to one outer lead portion, for simplicity.
Figure 8:
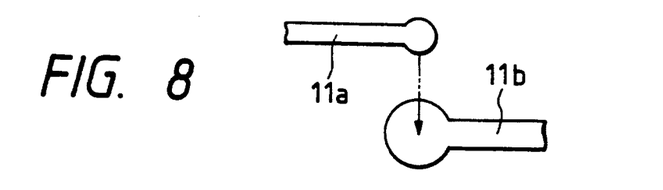
FIGS. 8 and 9 are diagrams showing additional coupling modes.
Figure 9:
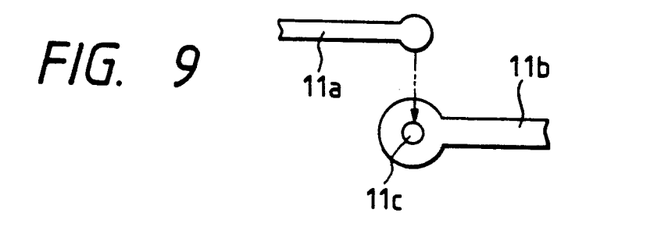
Figure 18:
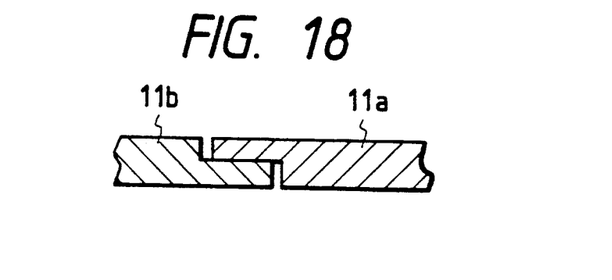
FIG. 18 is a sectional view showing a further connection of the inner and outer lead portions 11a and 11b according to the second embodiment of the invention.

In connecting leads 11a and 11b, the lead shapes may be varied, providing beneficial effects. For example, the outer leads 11b may be relatively wide as shown in FIG. 7, to increase their rigidity. The leads 11a and/or 11b may also be shaped so as to have enlarged tips, as shown in FIG. 8. The enlarged tips are suitable for more securely holding solder or adhesive. Additionally, the tips of the leads may be apertured as shown in FIG. 9. With the apertured tips, solder or adhesive is even more securely held, increasing adhesive strength. Further, as shown in FIG. 18, the tips of the leads 11a and 11b may be half-etched to form stepped parts. The stepped parts of the leads are laid one upon the other for coupling purposes as shown in FIG. 18. In this case, the jointed portion of the leads thus coupled have smoothed surfaces.

As already stated, in manufacturing a plurality of inner lead frames 12 and a plurality of outer lead frames 13 assembled into the frame 20, both frames making up the electronic-parts mounting board frame 100, a metal plate is formed into predetermined patterns by a suitable means, such as by punching. For example, a single metal plate may be punched to form the inner lead frames 12 or the outer lead frames 13. That is, a number of lead frames may be punched out of a single metal plate. In this case, the punching work is applied separately to the inner lead frames 12 or the outer lead frames 13. This simplifies their manufacture, and improves the efficiency of the manufacturing operation. In the instant embodiment, 150 inner lead frames 12 were punched out of a 1/6 square meter copper plate. 42 outer lead frames 13 corresponding to the inner lead frames 12 were punched out of a ⅙ square meter 42-alloy plate.

The electronic-parts mounting board frame 100 thus constructed is manufactured in the following manner: The insulating substrate 14 is pressed on both sides of each inner lead frame 12, so that those are combined into a single unit. Necessary conductive circuit 15 and through-holes 16 are formed on and in the structure. Thereafter, the tie bars 12a are cut off to form the inner leads 11a, which are caused to independently protrude from the insulating substrate 14. Then, the electrical connection of the inner leads 11a to the conductive circuits 15 through the through-holes 16 is checked for each of the electronic-parts mounting boards 10, and the electronic-parts mounting boards having defective electrical connections are removed. The non-defective electronic-parts mounting boards 10 are thus selected and, as shown in FIG. 3, assembled into the outer lead frames 13 which have been assembled into the frame 20.

An electronic part (e.g., a semiconductor element) 40, as shown in FIG. 10, is mounted on one or both sides of the insulating board 14 of each electronic-parts mounting board 10. The electronic part 40 and the conductive circuit 15 are electrically connected by a bonding wire 41. Finally, the structure is entirely sealed with mold resin 50 thus completing, in this example, an intended semiconductor device 200.

The electronic-parts mounting boards 10 making up the electronic-parts mounting board frame 100, in the second embodiment of the invention, may be used for forming the semiconductor device 200, as shown in FIG. 10. To form the device, the electronic part 40 is mounted on the electronic-parts mounting board 10. The structure is entirely sealed with the mold resin 50, in a state in which the outer leads 11b extend outwardly. The electronic-parts mounting boards 10 thus formed are assembled into the frame 20 by using the leads 11. An additional embodiment to be described later employs an assembly in which a plurality of outer leads 11b of each electronic-parts mounting board 10 are assembled into a single frame 20, and in which the electronic-parts mounting boards 10 are assembled into the frame 20 and fixed thereto by the leads 11.

In the electronic-parts mounting board frame 100, the leads 11, as also shown in FIG. 3, are formed by connecting the inner leads 11a and the outer leads 11b by means of solder, for example. As already stated, the leads 11a and 11b are formed of different members. The outer leads 11b are protected by the frame 20. Those leads 11a and 11b when interconnected are electrically continuous and are shaped to correspond to that of frame 20. Specifically, the electronic-parts mounting board frame 100 is formed in such a way that the insulating substrate 14 is applied to both sides of the inner lead frames 12 as shown in FIG. 4, thereby combining them into single units, and the single units are assembled into outer lead frames 13, and the outer lead frames 13 are enclosed by the frame 20 as shown in FIG. 6.

In the structure shown in FIG. 5, after the tie bars 12a are cut off, electrical tests are performed on the inner leads 11a and the conductive circuits 15 coupled therewith, independently of the outer leads 11b. The result is that only non-defective inner lead frames 12 are used for the resultant electronic-parts mounting board frame 100. Therefore, the product quality, particularly the electrical performances, of the frames is improved in comparison with products in which the leads are continuous.

This fact also improves production yield in manufacturing the electronic-parts mounting board frames 100. The inner leads 11a and the outer leads 11b coupled with the frame 20, which cooperate to form the leads 11 and tend to be defective, may be electrically tested individually, before the electronic-parts mounting boards 10 containing them are assembled. Therefore, the electronic-parts mounting boards 10 assembled from thos electrically tested leads 11a and 11b have much fewer defects, providing an excellent production yield.

In accordance with the invention, the inner lead frames 12 and the outer lead frames 13 coupled to the frame 20 are formed of different discrete members. Further, in forming the lead frames, increased tolerances for the inner and outer leads 11a and 11b are possible. The number of lead frames that can be punched out of a metal plate of a fixed area is about three times the number of lead frames in which the leads consists of physically continuous inner and outer leads. For example, the present invention has been made to achieve a yield of about 900 pieces/square meter, while in the case of continuous leads the yield achieved was 336 pieces/square meter.

The inner lead frames 12, each having a preset number of inner leads 11a, are manufactured as standard products. In this case, the present number of the leads 11a is preferably as large as possible. The outer lead frames 13 having the outer leads 11b protected by the frame 20 may then be separately customized for different types of products. In this way, the electronic-parts mounting board frame 100 itself can be readily standardized while nevertheless permitting use in a variety of different applications. This is a very beneficial feature in view of recent market trends calling for cutomized manufacture of small numbers of products for each of a variety of different applications.

In the semiconductor device 200 based on the electronic-parts mounting board frames 100, the outer leads 11b not only extend outside the device 200 but furthermore are designed to be directly connected to other boards. Therefore, the outer leads 11b must be sufficiently rigid to satisfy such usages. In the electronic-parts mounting board frame 100, different members are used for the inner lead frames 12 of the inner leads 11a and the outer lead frames 13 of the outer leads 11b. Therefore, the member selected for the outer lead frames 13 may have a higher rigidity than the member for the inner lead frames 12. The electronic-parts mounting board frames 100 may be designed so that their outer leads 11b have satisfactorily high rigidity.

Figure 11:
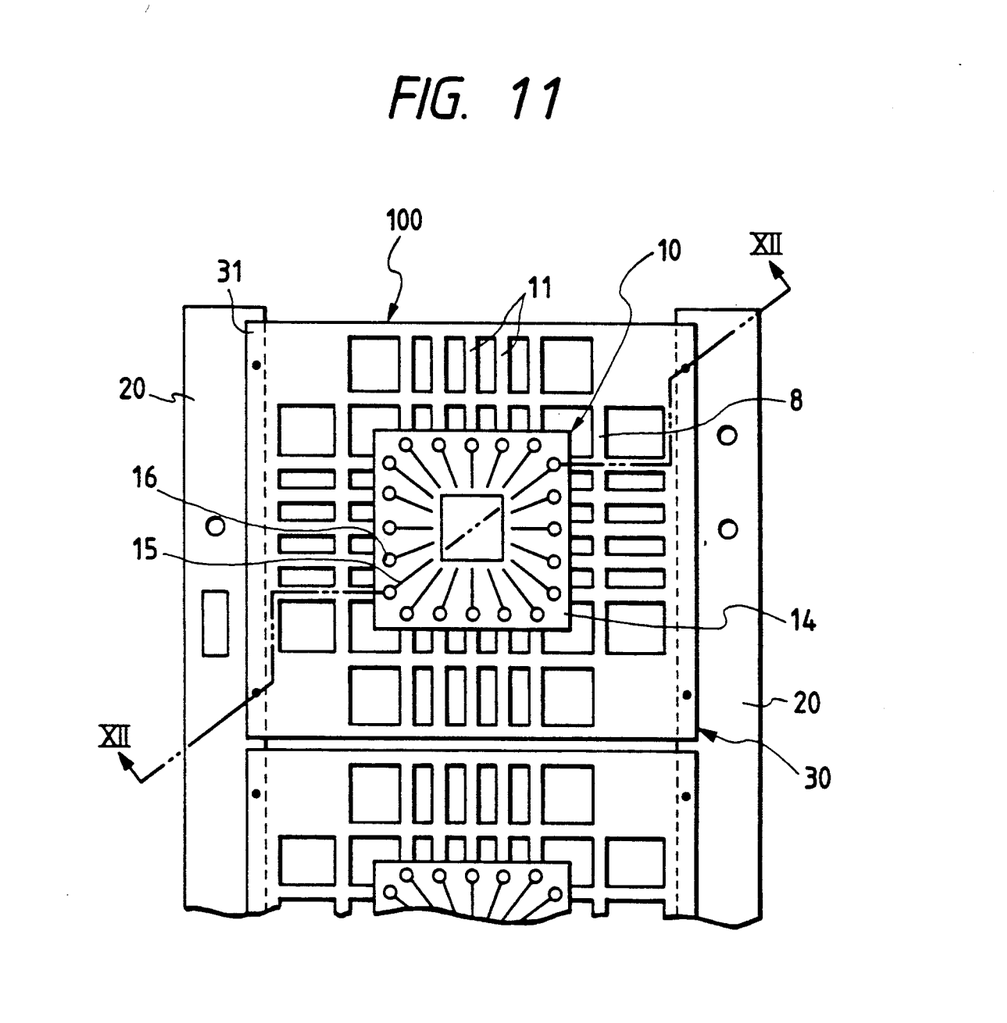
FIG. 11 is a partial enlarged plan view showing an electronic-parts mounting board frame according to a third embodiment of the invention.
Figure 12:
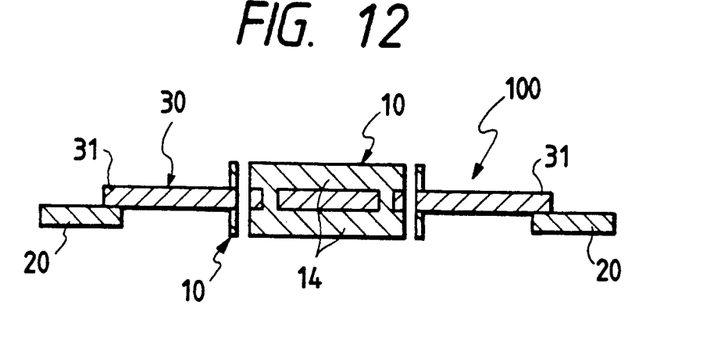
FIG. 12 is a section view taken on line XII—XII in FIG. 11.

A third embodiment of an electronic-parts mounting board frame 100 according to the present invention will be described with reference to FIGS. 11 to 14, 16, 17, and 19. In this embodiment, the electronic-parts mounting boards 10 are assembled into the frame 20 by using a lead frame 30. The lead frame 30 is formed by unifying groups of leads 11 by means of an outer frame 31. To be more specific, to form the lead frame 30, grouped leads 11 for the electronic-parts mounting board 10 are connected by means of tie bars and the external ends of the leads 11 are connected to the outer frame 31. An insulating substrate 14 is applied to both sides of the central part of the lead frame 30. Then, necessary conductive circuit 15 are formed on the structure, and through-holes 16 are formed in the structure. The electronic-parts mounting boards 10 thus constructed, as shown in FIGS. 11 and 12, are each fixed to one frame 20 at the peripheral edge 31 of the lead frame 30.

As described above, in the embodiment shown in FIGS. 11 and 12, the electronic-parts mounting boards 10 are assembled into the frame 20 by utilizing the outer frame 31 located at the tips of the leads 11. To fix the frame 31 into the frame 20, both sides of the outer frame 31 are placed on the frame 20, and spot welded at the black points shown in FIG. 11 by resistance welding.

Figure 19:
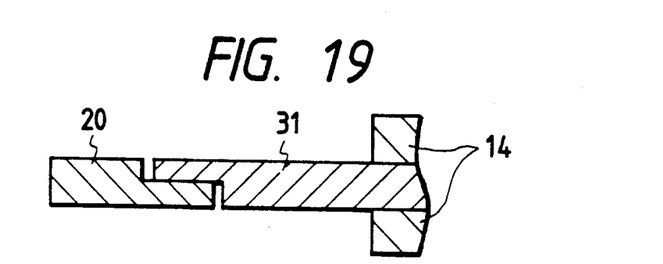
FIG. 19 is a sectional view showing another connection of the frame 20 and the outer frame 31 according to the third embodiment of the invention.

In this case, the inner side of the frame 20 and both sides of the outer frame 31 may be half-etched in order to form steps, as shown in FIG. 19. When the frames 20 and 31 are coupled, the stepped parts are laid one upon the other. The jointed portions of the frame 20 and the outer frame 31 have smoothed surfaces. With the smoothed surfaces of the jointed portions, the electronic-parts mounting board frame 100 may be easily positioned in or out of related equipment as necessary. In this embodiment, the frame 20 and the lead frame 30 are both made of copper alloy.

Figure 13:
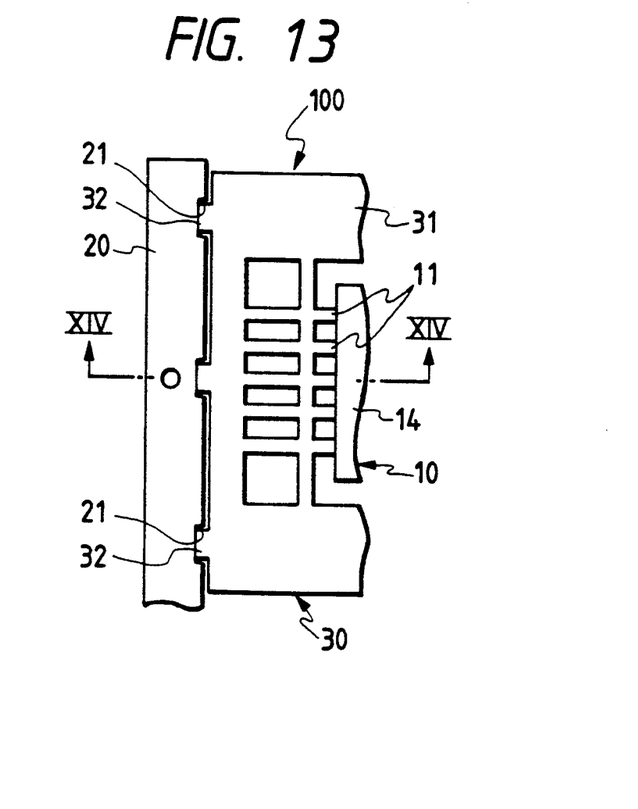
FIG. 13 is a partial enlarged plan view showing a modification of the electronic-parts mounting board frame according to the third embodiment.

A modification of the coupling of the electronic-parts mounting boards 10 with the frame 20 is illustrated in FIGS. 13 and 14. In this modification, as shown, both sides of the outer frame 31 have portions 32 protruding therefrom. The inner sides of the frame 20 have indented portions 21 shaped with a U-shape. When coupling the inner and outer frames, the protruding portions 32 of the frame 31 are inserted into the U-shaped indented portions 21 of the frame 20, respectively, and are fixed by or seam welding with electron beams. The electronic-parts mounting board 10 is automatically positioned with respect to the frame 20 when the protruding portions 32 are inserted into the indented portions 21. As a result, no stepped portions in the surface of the frame 20 are required. This provides a smooth positioning of the electronic-parts mounting board frames 100.

The embodiment of FIG. 13 may be further modified as shown in FIG. 19. In this modification, the faces of the protruding portions 32 which are to be jointed, and the indented portions 21, are half-etched to be stepped as shown. For coupling the board with the frame, the stepped portions are laid one upon the other. As in the previous modification, no stepped portions are formed in the jointed portion of the protruding portions 32 and the indented portions 21, providing for smooth frame positioning. The frame 20 and the lead frame 30 are both made of 42 alloy.

Figure 16:
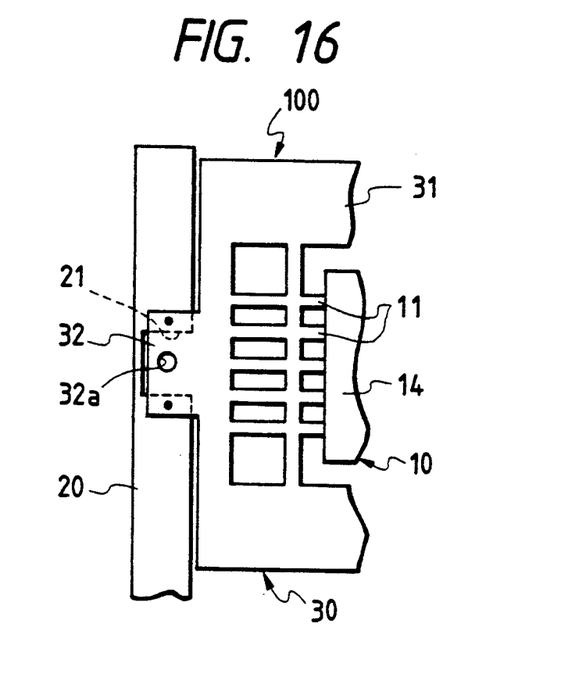
FIG. 16 is a partial enlarged plan view showing an additional modification of the connection of the frame and the outer lead frame in the third embodiment.

A modification of the third embodiment of an electronic-parts mounting board frame 100 according to the present invention will be described with reference to FIG. 16. In this modification, the lead frame 30 and the frame 20 include, respectively a protruding portion 32 and an indented portion 21, as in the embodiment of FIG. 13. The protruding portion 32, which protrudes from a location at the midpoint of the side edge of the lead frame 30, is larger than the indented portion 21. The protruding portion 32 has a pilot hole 32a at the center. The pilot hole 32a is used when the electronic-parts mounting board frame 100 is transferred and the frame per se is applied to a related equipment. The protruding portion 32, when located at the midpoint of the side edge of the lead frame 30, reliably positions the electronic-parts mounting board 10 when work is applied to the board. The fact that the protruding portion 32 is larger than the indented portion 21, results in easy repositioning of the electronic-parts mounting board 10 in the frame 20. Spot welding by a YAG laser is applied to the overlapping portion of the protruding portions 32 within the frame 20, to couple them. In this embodiment, the frame 20 is made of copper alloy, and the lead frame 30 is made of 42 alloy.

As described above, in the electronic-parts mounting board frame 100 according to the third embodiment shown in FIGS. 11 to 14, 16 and 19, the grouped leads 11 for each electronic-parts mounting board 10 are coupled together by the outer frame 31, to form the lead frame 30. The outer frame 31 of the lead frame 30 of each electronic-parts mounting board 10 is assembled into the frame 20, to thereby form an electronic-parts mounting board frame 100. If one or more of the lead frames 30 of the electronic-parts mounting boards 10 assembled into the electronic-parts mounting board frame 100 is defective, the board 10 containing the defective lead frame 30 may be removed or replaced by a non-defective one. The remaining boards can be used as they are.

The conventional lead frame consists of a plurality of parts in order to form a number of electronic-parts mounting boards 10. On the other hand, in the present invention, the lead frames 30 for the electronic-parts mounting boards 10 are individually formed. In manufacturing, the electronic-parts mounting board 10 experiences many manufacturing steps. For example, an electronic part 40 is mounted on the electronic-parts mounting board 10. To ease the manufacturing work, the outer frames 31 of the lead frames 30 of the electronic-parts mounting boards 10 are assembled into a single frame 20, as shown in FIG. 1.

As described above, the present invention brings about many beneficial features.

In the electronic-parts mounting board frame 100 according to the first embodiment, a plurality of electronic-parts mounting boards 10 are assembled into one frame 20 and fixed to the frame by grouped leads 11, to thereby form a single piece construction. If any of the electronic-parts mounting boards 10 is defective, only the defective one is removed and replaced with a non-defective one, while the remaining non-defective boards are used as they are. Therefore, the cost to manufacture the electronic-parts mounting board 100 is reduced. Electrical testing of the electronic-parts mounting boards 10 can be accomplished before the electronic-parts mounting boards 10 are assembled in the frame 20. Therefore, the fixing work of the boards to the frame is efficiently done, and the production yield of the electronic-parts mounting board frames 100 is improved.

By assembling the electronic-parts mounting boards 10 into the frame 20, the electronic parts 40 may be efficiently mounted on the electronic-parts mounting boards 10. Particularly if the frames 20 each having a prescribed pattern are previously manufactured, the electronic-parts mounting boards 10 may be routinely assembled using an automated mounting equipment for mounting the electronic parts 40. Therefore, the electronic-parts mounting board frame 100 is especially convenient when semiconductor devices 200 are formed by the electronic-parts mounting boards 10.

In the electronic-parts mounting board frame 100 according to the second embodiment, the leads 11 for each electronic-parts mounting board 10 include inner leads 11a and outer leads 11b. The inner leads 11a to which the insulating substrates 14 are applied, and the outer leads 11b integral with the frame 20, are formed of different members. Accordingly, the electronic-parts mounting board frame 100 of this embodiment enjoys the same advantages as does the first embodiment. In particular, the inner lead frames 12, which are difficult to manufacture and expensive, may be used for each electronic-parts mounting board 10. This allows only the non-defective electronic-parts mounting boards 10 to be used for the electronic-parts mounting board frame 100. The result is to reduce the cost and improve manufacturing yield of the resultant electronic-parts mounting board frames 100.

Additionally, a number of the inner leads 11a and a number of the outer leads 11b, which make up the leads 11, may be previously manufactured. The conductive circuits 15 on the insulating substrate 14 are selectively connected to the inner leads 11a, through the through-holes 16. The electronic-parts mounting boards 10 thus manufactured have an excellent versatility in usage.

In the electronic-parts mounting board frame 100 according to the third embodiment, the lead frames 30 are previously manufactured for the electronic-parts mounting boards 10. The lead frames 30 are assembled into and fixed to the frame 20 by the outer frames 31, to thereby form a single piece construction. Therefore, the third embodiment has advantages comparable with those obtained by the first embodiment.

Furthermore, in this embodiment, a number of leads 11 necessary for the electronic-parts mounting board 10 are unified by each outer frame 31, to thereby form lead frames 30. The lead frames 30 thus formed are assembled into and fixed to the frame 20 by the outer frames. Accordingly, the lead frames 30 may be formed individually, leading to cost reduction.

The lead frames 30 may be connected to the frame 20 in such a manner that protruding portions 32 of the lead frames 30 are inserted into indented portions 21 of the frame 20. In this case, the resultant electronic-parts mounting board frame 100 is entirely flat in shape. The positioning of the electronic-parts mounting boards 10 to the frame 20 is therefore simplified.

As seen from the foregoing description, the electronic-parts mounting boards 10 to be assembled into one frame 20 may be manufactured in different forms. This feature is very useful for customized manufacture of small volumes of different products. When the electronic-parts mounting boards 10 are connected to the frame 20 by laying the half-etched portions one upon the other, the resultant electronic-parts mounting board frame 100 is planar in shape. The planar shape provides, for example, for smooth positioning, of the electronic-parts mounting board frame 100 on a mounting equipment for mounting electronic parts 40.

Finally, it will be understood by those skilled in the art that the phrase electronic-parts mounting board refers to a board on which either a plurality of electronic parts or a single electronic part is mounted: The principles of the invention apply equally to etiher situation and it is consequently intended that the phrase electronic parts mounting board as used in the above description and the appended claims be construed to mean any board on which at least one electronic part could be mounted.

What is claimed is:

1. An electronic-parts mounting board frame comprising:
   a plurality of electronic-parts mounting boards;
   a single frame into which said plurality of electronic-parts mounting boards are assembled; and
   a plurality of leads arranged in each said electronic-parts mounting board and having external lead ends protruding therefrom, the external ends of said plurality of leads being electrically connected to said frame.

2. An electronic-parts mounting board frame according to claim 1, in which the external ends of said plurality of leads are connected to said frame by spot welding.

3. In a plurality of electronic-parts mounting boards to be assembled into a single frame, the improvement wherein each electronic-parts mounting board includes a plurality of leads separate from said frame but arranged to be electrically connected thereto.

4. An electronic-parts mounting board frame comprising:
- a plurality of electronic-parts mounting boards respectively provided with insulating substrates;
- a single frame into which said plurality of electronic-parts mounting boards are assembled; and
- a plurality of lead frames each including a plurality of leads and, extending around a periphery of said lead frame, an outer frame integral with said plurality of leads; wherein said insulating substrates are applied to two sides of said lead frames, thereby to form single units, and said plurality of electronic-parts mounting boards are assembled into said single frame by electrically connecting said outer frames of said plurality of lead frames to said single frame.

5. An electronic-parts mounting board frame comprising:
- a plurality of electronic-parts mounting boards respectively provided with insulating substrates;
- a single frame into which said plurality of electronic-parts mounting boards are assembled; and
- a plurality of lead frames each including a plurality of leads and, extending around a periphery of said lead frame, an outer frame integral with said plurality of leads; wherein said insulating substrates are applied to two sides of said lead frames, thereby to form single, units, and said plurality of electronic-parts mounting boards are assembled into said single frame by electrically connecting said outer frames of said plurality of lead frames to said single frame, in which a plurality of protruding portions protrude from a middle of two sides of said single units, a plurality of indented portions are formed in inner sides of said single frame, an area of each said protruding portion being larger than an area defined by each said indented portion, and a central part of each said protruding portion includes a pilot hole.

6. An electronic-parts mounting board frame according to claim 5, in which spot welding by a YAG laser is applied to portions of said protruding portions which overlap said frame.

7. An electronic-parts mounting board comprising a lead frame integral with a plurality of leads and, extending around an outer periphery of the lead frame, means including an outer frame for electrically connecting said leads via said outer frame to a single frame in which a plurality of said electronic parts mounting boards are assembled, said board further including an insulating board attached to two principal planar sides of said lead frame.

8. An electronic-parts mounting board frame according to claim 1, in which the external ends of said plurality of leads are connected to said frame by soldering.

9. An electronic-parts mounting board frame according to claim 1, in which the external ends of said plurality of leads are positioned directly on said frame.

10. An electronic-parts mounting board frame according to claim 1, in which the external ends of said plurality of leads abut against said frame.

11. An electronic-parts mounting board frame according to claim 1, in which the external ends of said plurality of leads and portions of said frame are half-etched, and the half-etched external ends of said plurality of leads are positioned on and connected to the half-etched portions of said frame.

12. An electronic-parts mounting board frame according to claim 4, in which an inner side of said single frame and sides of said outer frames are half-etched to form steps, and the stepped portions of said single frame and the stepped portions of said outer frames are laid one upon the other to form a joint therebetween.

13. An electronic-parts mounting board frame according to claim 4, in which a plurality of protruding portions of said outer frame protrude from sides of said single units, a plurality of indented portions are formed in inner sides of said single frame, said protruding portions are inserted into said indented portions, and the protruding and indented portions are joined.

* * * * *